(12) United States Patent
Tan et al.

(10) Patent No.: US 7,923,180 B2
(45) Date of Patent: Apr. 12, 2011

(54) CROSS TECHNOLOGY RETICLES

(75) Inventors: Sia Kim Tan, Singapore (SG); Guoxiang Ning, Singapore (SG); Gek Soon Chua, Singapore (SG); Soon Yoeng Tan, Singapore (SG); Byoung Il Choi, Singapore (SG); Jason Phua, Singapore (SG)

(73) Assignee: Chartered Semiconductor Manufacturing, Ltd., Singapore (SG)

( * ) Notice: Subject to any disclaimer, the term of this patent is extended or adjusted under 35 U.S.C. 154(b) by 71 days.

(21) Appl. No.: 12/369,720

(22) Filed: Feb. 11, 2009

(65) Prior Publication Data

US 2009/0286167 A1    Nov. 19, 2009

Related U.S. Application Data

(63) Continuation-in-part of application No. 12/122,866, filed on May 19, 2008.

(51) Int. Cl.
*G03F 1/00* (2006.01)
*G03F 7/00* (2006.01)

(52) U.S. Cl. .......................................... 430/5; 430/311
(58) Field of Classification Search ............... 430/5, 311, 430/312, 313; 716/19, 20, 21
See application file for complete search history.

(56) References Cited

U.S. PATENT DOCUMENTS

| 6,646,722 B2 | 11/2003 | Pierrat |
| 6,710,851 B1 | 3/2004 | Elmer et al. |
| 6,968,532 B2 | 11/2005 | Sivakumar et al. |

OTHER PUBLICATIONS

Yamamoto Yasuhisa et al., Multi-layer reticle (MLR) strategy application to double-patterning/double-exposure for better overlay error control and mask cost reduction, Photomask Technology 2007, pp. 67302(x), vol. 6730, Robert J. Naber; Hiroichi Kawahira, Editors.

*Primary Examiner* — Stephen Rosasco
(74) *Attorney, Agent, or Firm* — Horizon IP Pte Ltd (57) ABSTRACT

A method of fabricating a device is presented. The method includes forming a mask that includes multiple images. A substrate is patterned using the mask. An image of the multiple images corresponds to a respective patterning process. The substrate is processed further to complete the processing of the substrate to form the desired function of the device.

18 Claims, 8 Drawing Sheets

CROSS TECHNOLOGY RETICLES

CROSS-REFERENCE TO RELATED APPLICATION

This application is a continuation-in-part application which claims benefit of co-pending U.S. patent application Ser. No. 12/122,866, filed on May 19, 2008. All disclosures are incorporated herewith by reference.

BACKGROUND

Integrated circuits can be found in many of today's consumer electronics, such as cell phones, video cameras, portable music players, printers, computers, etc. Integrated circuits may include a combination of active devices, passive devices and their interconnections.

Photolithography is one of the principle processes in the manufacture of integrated circuits, and consists of patterning the surface of a semiconductor wafer in accordance with the design and layout of the integrated circuits to be formed. Generally, the photolithography process and its corresponding equipment consist of a light source transmitted through an optical system onto a reticle or mask with a pattern. The pattern produced by the light and the reticle or mask is then aligned to a wafer covered with a light-sensitive photoresist by an alignment system, wherein the pattern is then transferred to the photoresist.

The photolithography process of transferring a pattern to a photoresist is commonly described as a layer-by-layer methodology, wherein each layer is formed by exposing a reticle with only a single layer image. Thus, as integrated circuits become more complex, some manufacturing designs require the use of thirty or more reticles, and at a cost of several thousand dollars each, the expense of producing these reticles for a low volume run can become prohibitively expensive.

Thus, a need still remains for a reliable reticle system and method of fabrication and a reliable integrated circuit system and method of fabrication, wherein the reticle system and the integrated circuit system are formed using a multi-layer reticle grouping/pairing flow that matches corresponding multiple layers on a same reticle, thereby reducing the number of reticles. In view of the ever-increasing commercial competitive pressures, increasing consumer expectations, and diminishing opportunities for meaningful product differentiation in the marketplace, it is increasingly critical that answers be found to these problems. Moreover, the ever-increasing need to save costs, improve efficiencies, and meet such competitive pressures adds even greater urgency to the critical necessity that answers be found to these problems.

Solutions to these problems have been long sought but prior developments have not taught or suggested any solutions and, thus, solutions to these problems have long eluded those skilled in the art.

SUMMARY

A method of fabricating a device is disclosed. The method includes forming a mask that includes multiple images. A substrate is patterned using the mask. An image of the multiple images corresponds to a respective patterning process. The method further includes continue processing of the substrate to complete processing of the substrate to form the desired function of the device.

A mask for device fabrication is presented in one embodiment. The mask includes a mask substrate and a plurality of images formed on the mask substrate which correspond to different patterning processes used to fabricate one or more devices.

In another embodiment, a method for forming a mask used in device fabrication is presented. The method includes providing a mask substrate. The method further includes forming a plurality of images on the mask substrate which correspond to different patterning processes used to fabricate one or more devices.

Certain embodiments of the invention have other aspects in addition to or in place of those mentioned above. The aspects will become apparent to those skilled in the art from a reading of the following detailed description when taken with reference to the accompanying drawings.

DETAILED DESCRIPTION

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown exaggerated in the drawing FIGs. Additionally, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional plane or surface of the substrate, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "processing" as used herein includes deposition of material or photoresist, patterning, exposure, development, etching, cleaning, and/or removal of the material or photoresist as required in forming a described structure.

The term "on" is used herein to mean there is direct contact among elements.

The terms "example" or "exemplary" are used herein to mean serving as an instance or illustration. Any aspect or embodiment described herein as an "example" or as "exemplary" is not necessarily to be construed as preferred or advantageous over other aspects or designs.

The term "layer" encompasses both the singular and the plural unless otherwise indicated.

The term "pitch" is used herein to mean the center-to-center distance between features in a pattern.

The terms "mask" and "reticle" as used herein are to be used interchangeably as the present embodiments are equally applicable to either system or method (e.g., mask or reticle) of forming a pattern by photolithography.

The term "system" as used herein means and refers to the method and to the apparatus of the present invention in accordance with the context in which the term is used.

Generally, the following embodiments relate to the formation of a multi-layer reticle that employs a grouping/pairing system that matches corresponding multiple layers on the same reticle. By employing the grouping/pairing system described herein, better pattern resolution and CD performance can be achieved for 65 nanometer and beyond technology nodes at a reduced cost. Additionally, as the technology node of electronic circuits continues to decrease, it is becoming increasingly more important to reduce process critical dimension (CD) loss, thereby improving pattern resolution and CD performance, for 65 nanometer generation (and below) wafer processing.

However, reticle CD performance for sub-65 nanometer technology nodes is greatly diminished when the photomask plasma etch optimization process is required to form several critical feature sizes on a reticle at the same time. Moreover, it has been discovered that CD loss is even more severe when multiple images of different density are put on the same reticle. With this in mind, the present inventors discovered that large density differences between the different images placed on the same reticle may cause issue with regards to CD SPEC and CD-linearity profile due to problems encountered during the photomask plasma etch optimization process.

Since current photomask technology (e.g., 90 nanometer node and beyond) requires that several critical feature sizes be fabricated on the photomask at once, with all features being of equal importance, the etch difference or linearity between these several feature sizes is now becoming quite critical. It will be appreciated by those skilled in the art that Critical Dimension (CD) Etch Linearity can be defined as the difference in CD Bias between small and large feature sizes within the same pattern on a photomask. At the 90 nanometer technology node and beyond, the increasing need for improved CD Etch Linearity and the absolute size fidelity of the chromium feature on the photomask compared to the design data (a.k.a. CD Etch Bias) is an obstacle for timely and cost effective reticle fabrication. The embodiments disclosed herein help to resolve these problems and provide solutions for the challenges encountered within the 90 nanometer technology processing node and beyond.

FIGS. 1-11, which follow, depict by way of example and not by limitation, one or more exemplary systems or methods used to fabricate a reticle system and/or an integrated circuit system and they are not to be construed as limiting. It is to be understood that a plurality of conventional processes that are well known within the art and not repeated herein, may precede or follow FIGS. 1-11. Moreover, it is to be understood that many modifications, additions, and/or omissions may be made to the below described process without departing from the scope of the claimed subject matter. For example, the below described process may include more, fewer, or other steps. Additionally, steps may be performed in any suitable order without departing from the scope of the present invention.

Moreover, it is to be appreciated that the integrated circuit system of the present disclosure may include any number of active devices (e.g., a multi-electrode device in which the current flowing between two specified electrodes is controlled or modulated by the voltage applied at a control electrode) and/or passive devices and their interconnections. Exemplary illustrations of the one or more active devices may include, without limitation, an n-channel field effect transistor (NFET), a p-channel field effect transistor (PFET), a complementary metal-oxide-silicon (CMOS) configuration, a single-gate transistor, a multi-gate transistor, a fin-FET, or an annular gate transistor. Exemplary illustrations of the one or more passive devices may include, without limitation, resistance devices with varying resistance values formed by strategically altering the process techniques. Furthermore, it is to be understood that one or more of the integrated circuit system could be prepared at one time on a medium, which could be separated into individual or multiple integrated circuit assemblies at a later stage of fabrication.

Furthermore, it is to be understood that the integrated circuit system manufactured by the embodiments described herein can be used within a multitude of electronic systems, such as processor components, memory components, logic components, digital components, analog components, mixed-signal components, power components, radio-frequency (RF) components (e.g., RF CMOS circuits), digital signal processor components, micro-electromechanical components, optical sensor components, and so forth, in numerous configurations and arrangements as may be needed.

Figure 1:
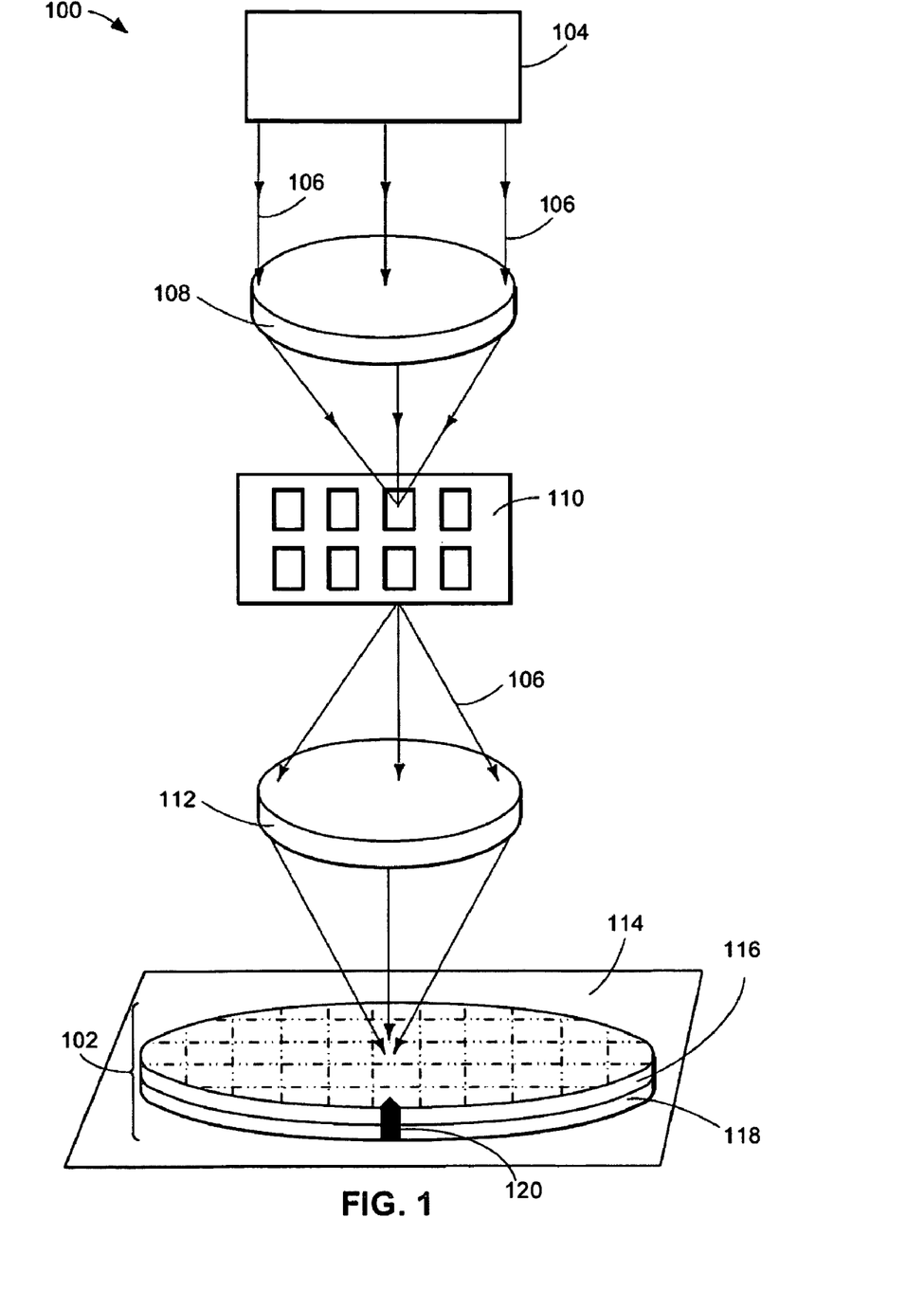
FIG. 1 is an isometric view of the basic elements of a photolithography system used to pattern an integrated circuit system in accordance with an embodiment of the present invention.

Referring now to FIG. 1, therein is shown an isometric view of the basic elements of a photolithography system 100 used to pattern an integrated circuit system 102 in accordance with an embodiment of the present invention.

The photolithography system 100 includes a radiation source 104, a radiation beam 106, a condenser 108, a reticle system 110, projection optics 112, and a stepper 114. Generally, the reticle system 110 is illuminated by the radiation beam 106 emitted from the radiation source 104 and a pattern of the reticle system 110 is projected onto a photoresist material 116, which coats a substrate 118. By way of example, the radiation source 104 may include any form of on-axis or off-axis energy that can be propagated as waves or streams of charged particles.

As is evident from the illustration, the radiation beam 106 emitted by the radiation source 104 passes through the condenser 108, and is projected onto the reticle system 110. In some embodiments, the condenser 108 may include optical lenses, mirrors, and apertures, such as slits, for the purpose of controlling and directing the radiation beam 106 onto a precisely defined area of the reticle system 110.

After passing through the reticle system 110, the radiation beam 106 carries information as to patterns formed on the reticle system 110. The resulting patterns are imaged onto the photoresist material 116 formed over the substrate 118 by the projection optics 112. The projection optics 112 may include mirrors, lenses, filters, apertures, and other optical devices for directing the radiation beam 106 onto the integrated circuit system 102.

It is to be understood that the photoresist material 116 may include any type of an energy sensitive film such as a negative tone resist, a positive tone resist, or a chemically amplified resist that is deposited by techniques well known in the art and not repeated herein. Additionally, it is to be understood that the photoresist material 116 may include one or more layers patterned one or more times with measured line widths below about 65 nanometers. Moreover, it will be appreciated by those skilled in the art that additional layers, such as a primer, a top anti-reflective coating and/or a bottom anti-reflective coating may be employed to enhance the development of the photoresist material 116.

After exposing the photoresist material 116, the substrate 118 can be baked and developed, leaving regions covered by the photoresist material 116 and complementary regions that are not covered. The pattern produced by the reticle system 110 may be used to manufacture integrated circuit components within the integrated circuit system 102. After several more semiconductor processing steps, including multiple additional patterning operations, the substrate 118 can be separated (e.g., diced) into individual or multiple semiconductor assemblies.

Each of the integrated circuit system 102 formed on the substrate 118 may include many different layers. These different layers may include metallization layers, semiconducting layers, dielectric layers, barrier layers, etc. The different layers may have different patterns, which may define circuit components, such as active devices, passive devices, and their interconnections. The different patterns and/or layers may be imaged by a single multi-layer reticle or multiple multi-layer reticles in a series of imaging operations.

It is to be understood that the photolithography system 100 presented above merely represents one example or illustration of such a system and there is no intention to limit any embodiment to this configuration, the illustrated parts, or the arrangement of parts.

Figure 2A:
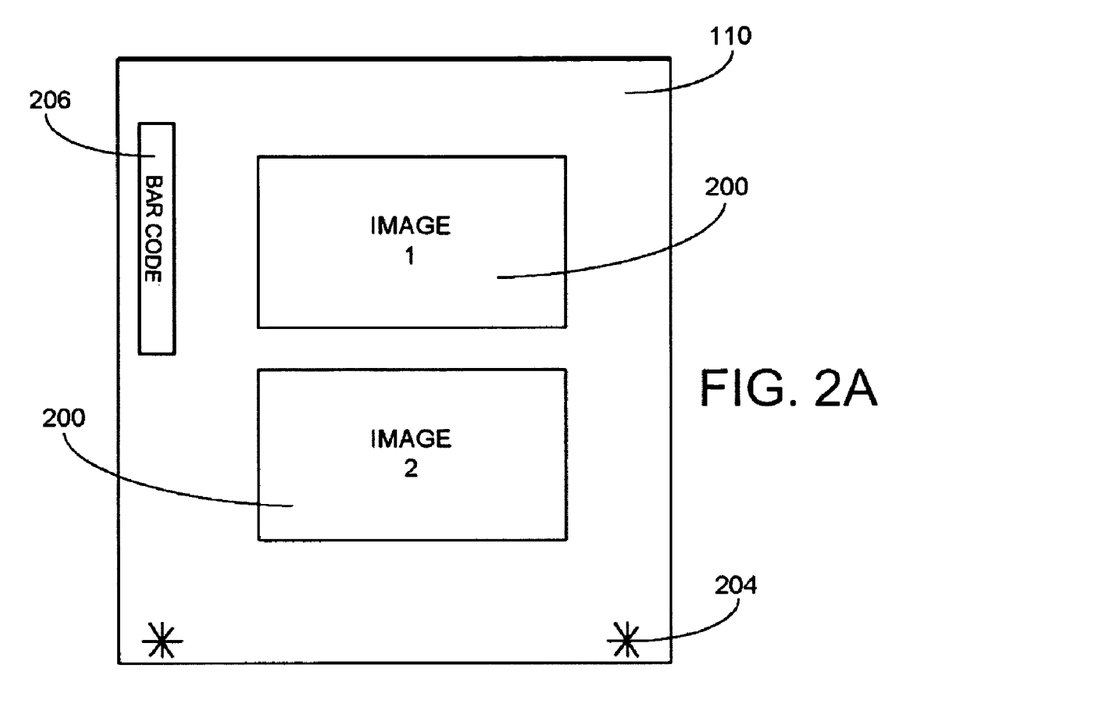
FIGS. 2a-b are plan views of embodiments of reticle systems.

Referring now to FIG. 2a, a plan view of the reticle system 110 in accordance with an embodiment is shown. It is to be understood that the reticle system 110 of the present embodiment illustrates or describes the placement of multiple layers (e.g., the various layers of similar or different integrated circuit designs) for one or more integrated circuit designs on a single reticle, rather than on multiple reticles.

Figure 2B:
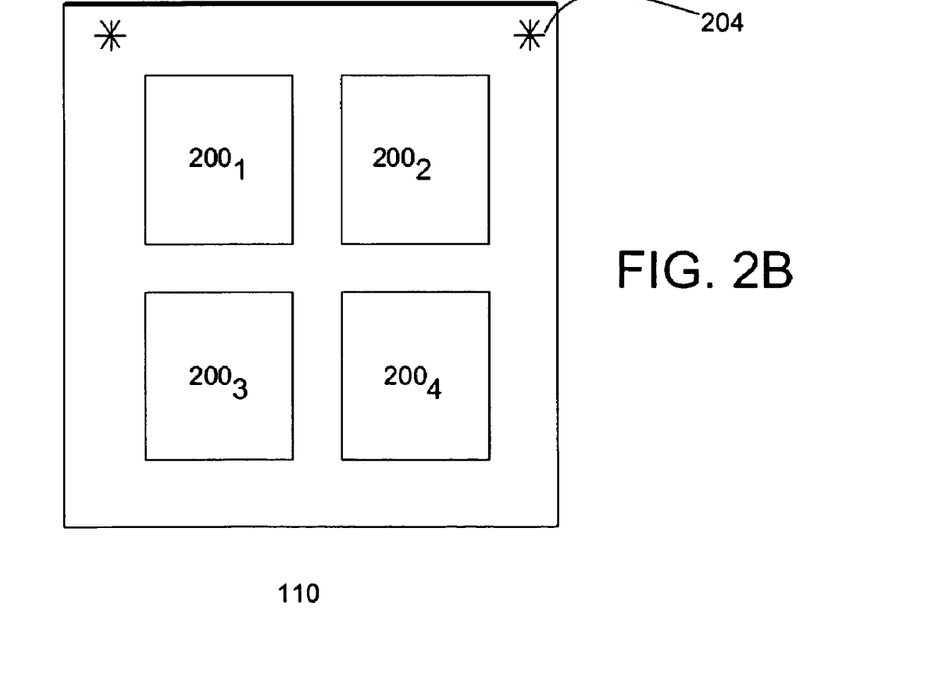

In one embodiment, the reticle system 110 includes a plurality of image patterns $200_{1-X}$, where $X \geq 2$. The image patterns, for example, correspond to layers on an integrated circuit system. It is to be understood that an image pattern 200 formed within the reticle system 110 includes suitable patterns for forming circuitry on a level or layer of the substrate 118, of FIG. 1, of the integrated circuit system 102. It will be appreciated by those skilled in the art that an image pattern can refer to a structure on the reticle system 110 that is used to modify the radiation beam, such that it alters the photoresist material in a desired manner. The images, for example, may be arranged in an array. The array may be a 1-dimensional or 2-dimensional array. For example, images $200_{1-2}$ may be arranged in a 1-dimensional array. Alternatively, as shown in FIG. 2b, images $200_{1-4}$ may be arranged in 2-dimensional array. Arranging the images in a non-array pattern is also useful.

Although the reticle systems are shown having two or four image patterns, it is to be understood that the reticle system 110 may include any whole integer number of the image pattern 200 that is greater than two. In some embodiments the number of the image pattern 200 formed on the reticle system 110 may depend upon the physical limitations mandated by equipment and design rules for forming the integrated circuit system 102. In other embodiments, the number of the image pattern 200 possible on one of the reticle system 110 can be determined by calculating the size of each of the image pattern 200 by adding the size of the engineering test structures to that of the integrated circuit system 102 (and scaling accordingly, where there is a size reduction during exposure) and comparing this with the maximum available area on the reticle system 110, based on the exposure tool and the necessary borders around each field to prevent nuisance patterns.

It will be appreciated by those skilled in the art that the reticle system 110 described herein is suitable for many kinds of lithographic processes, including photolithography using either reflective and refractive photomasks, electron beam lithography, x-ray lithography and ion beam lithography to name a few, may also be used without departing from the scope of the present invention.

Generally the reticle system 110 includes a transparent medium that is typically planar, essentially free of defects, and with a high optical transmission or reflection at a desired exposure wavelength of the photoresist material 116, thereby minimizing the percentage of energy absorbed by the reticle system 110. In some embodiments, the reticle system 110 can be made from several types of glasses such as, but not limited to, soda-lime glass, borosilicate glass, and quartz. However, it is to be understood that the reticle system 110 may also employ other materials that are compatible with the photolithography process, particularly when a material has favorable transmissivity characteristics when the wavelength of the exposure light source is less than 180 nm.

Typically, after the reticle system 110 has been polished, cleaned and inspected, it is ready to be coated with a reflective material, such as chromium, to form two or more of the image pattern 200, which can be strategically centered around a center point of the reticle system. The spacing of each of the image pattern 200 may also be varied by the designer, but should be consistent with control parameters of a conventional stepper, for example.

The reticle system 110 may also include one or more alignment markers 204 used for fine tuning the alignment of the reticle system 110. The alignment marker 204 is preferably formed along the periphery of the reticle system 110, thereby allowing the reticle system 110 to be positioned accurately within the photolithography system 100 (as shown in FIG. 1) during use. By way of example, a notch 120 on the substrate 118 (as shown in FIG. 1) can be aligned in the opposite direction to or in the same direction as the alignment marker 204 in FIG. 2A and FIG. 2B. It is to be understood that the notch 120 and the alignment marker 204 may be placed in any of various positions around the periphery of the reticle system 110 to ensure proper alignment of the reticle system 110 and registration of the image pattern 200. Also positioned along the periphery of the reticle system 110 is a bar code area 206 that may contain a set of alpha-numeric characters that allow for automatic recognition or identification of the reticle system 110.

FIGS. 3-6, described below, illustrate the placement of two or more different reticle layers (e.g., sub-patterns) for one or more integrated circuit designs on a single reticle, rather than on multiple reticles, by splitting the original target pattern into two or more sub-patterns, wherein each of the sub-patterns possesses a pitch greater than that of the original target pattern. Per this embodiment, the original target pattern is transferred to the substrate 118, of FIG. 1, for the corresponding layer via a multiple exposure technique (e.g., a double exposure/double etch process that utilizes a hardmask layer including dual trench and dual line approaches) in which the photoresist material 116, of FIG. 1, is exposed with each of the sub-patterns individually, thereby defining all of the features of the original target pattern. It is to be understood that splitting the target pattern into two or more sub-patterns may be useful for layers that contain pitches that exceed the resolution limits of the photolithography system 100.

Figure 3:
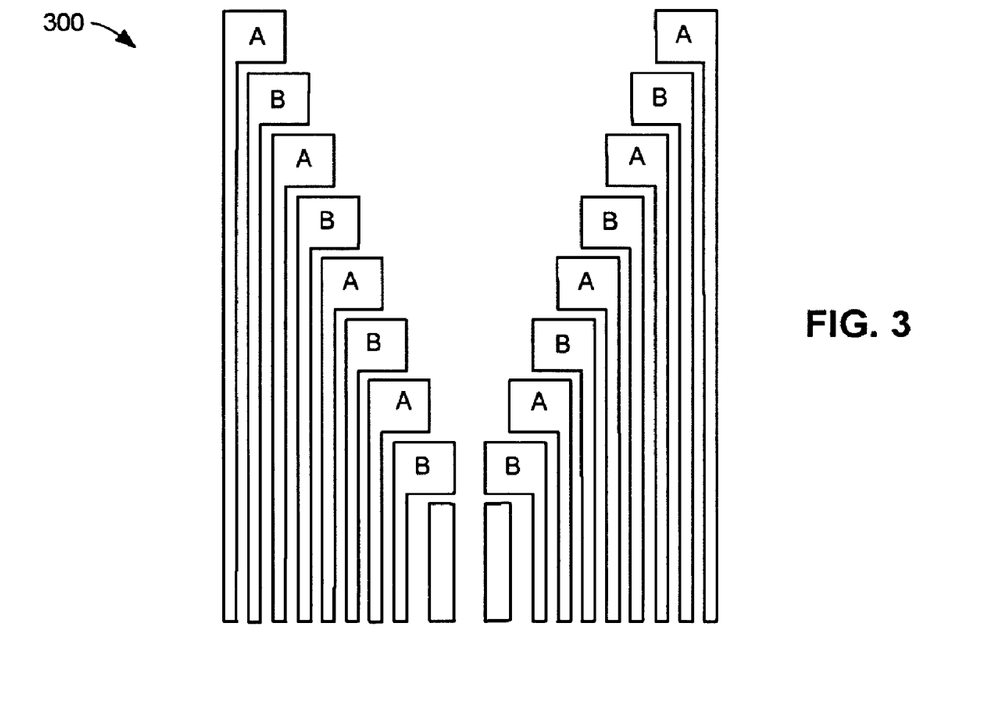
FIG. 3 is a plan view of a target pattern in accordance with another embodiment of the present invention.

Referring now to FIG. 3, therein is shown a plan view of a target pattern 300 in accordance with another embodiment of the present invention. Per this embodiment, the target pattern 300 may represent a pattern to be formed on the substrate 118, of FIG. 1, that exceeds the resolution limits of the photolithography system 100, of FIG. 1. Accordingly, an exposure of the target pattern 300 within the photolithography system 100 may result in the features to be formed not being successfully imaged and the resulting circuit pattern being defective. By way of example, the minimum pitch of the target pattern 300 may be 64 nanometers and below.

For ease of discussion, alternating features have been labeled with either an "A" or "B" to facilitate discussion below.

Figure 4:
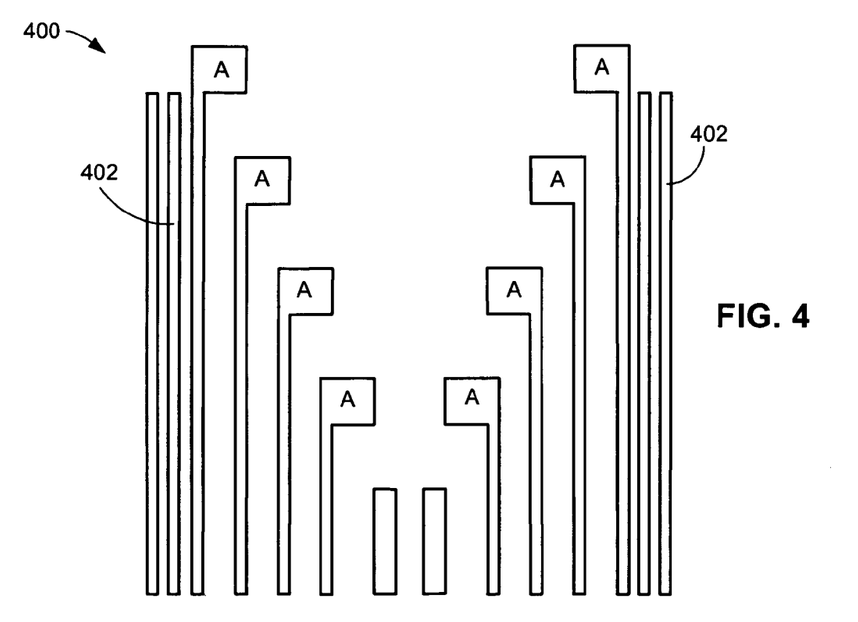
FIG. 4 is a plan view of a sub-pattern split from a target pattern in accordance with an embodiment of the present invention.

Referring now to FIG. 4, therein is shown a plan view of a sub-pattern 400 split from the target pattern 300, of FIG. 3, in accordance with an embodiment of the present invention. Per this embodiment, the target pattern 300 can be split into two or more of the sub-pattern 400, such as an image or pattern, wherein each of the sub-pattern 400 may possess a pitch greater than that of the target pattern 300. For purposes of illustration, the features have been marked with the letter "A" to better demarcate the sub-pattern separated from the target pattern 300. In some embodiments, the pitch of the sub-pattern 400 may be approximately double that of the pitch for the target pattern 300, for example. It will be appreciated by those skilled in the art that the sub-pattern 400 can refer to a structure on the reticle system 110, of FIGS. 1 and 2, that is used to modify the radiation beam 106, of FIG. 1, such that it alters the photoresist material 116, of FIG. 1, in a desired manner.

Additionally, it will be appreciated by those skilled in the art that one or more of a sub-resolution assist feature 402 can be formed on the reticle system 110 to improve print bias, for example.

As discussed further below in FIG. 9, each of the sub-pattern 400 can be grouped/paired on the reticle system 110 by employing a multi-layer reticle grouping/pairing flow 700, of FIG. 7.

Figure 5:
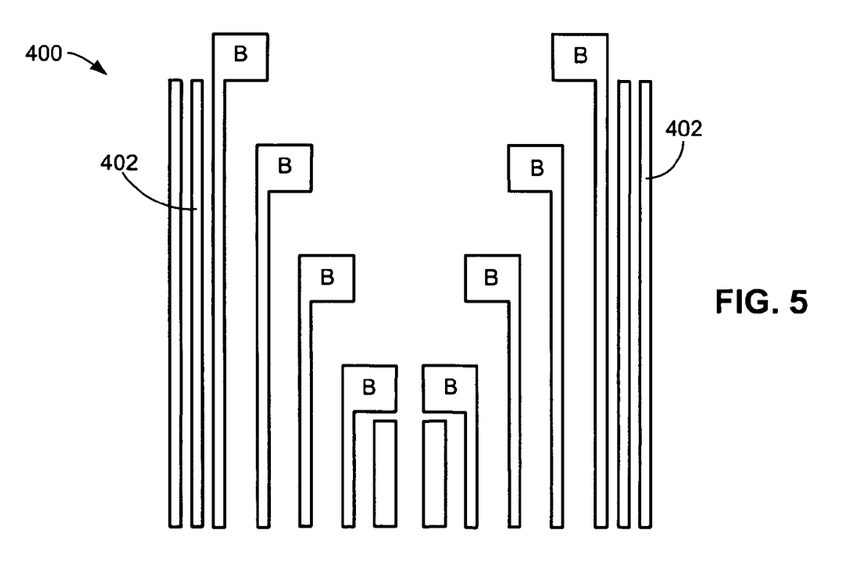
FIG. 5 is a plan view of another of a sub-pattern split from a target pattern in accordance with an embodiment of the present invention.

Referring now to FIG. 5, therein is shown a plan view of another of the sub-pattern 400 split from the target pattern 300, of FIG. 3, in accordance with an embodiment of the present invention. It is to be understood that each of the sub-pattern 400, such as an image or pattern, split from the target pattern 300 is a complement of the other, thereby forming the target pattern 300 upon exposure of each of the sub-pattern 400. For purposes of illustration, the features have been marked with the letter "B" to better demarcate the sub-pattern separated from the target pattern 300.

Additionally, it will be appreciated by those skilled in the art that one or more of the sub-resolution assist feature 402 can be formed on the reticle system 110, of FIGS. 1 and 2, to improve print bias, for example.

As discussed further below in FIG. 9, each of the sub-pattern 400 can be grouped/paired on the reticle system 110 by employing the multi-layer reticle grouping/pairing flow 700, of FIG. 7.

Figure 6:
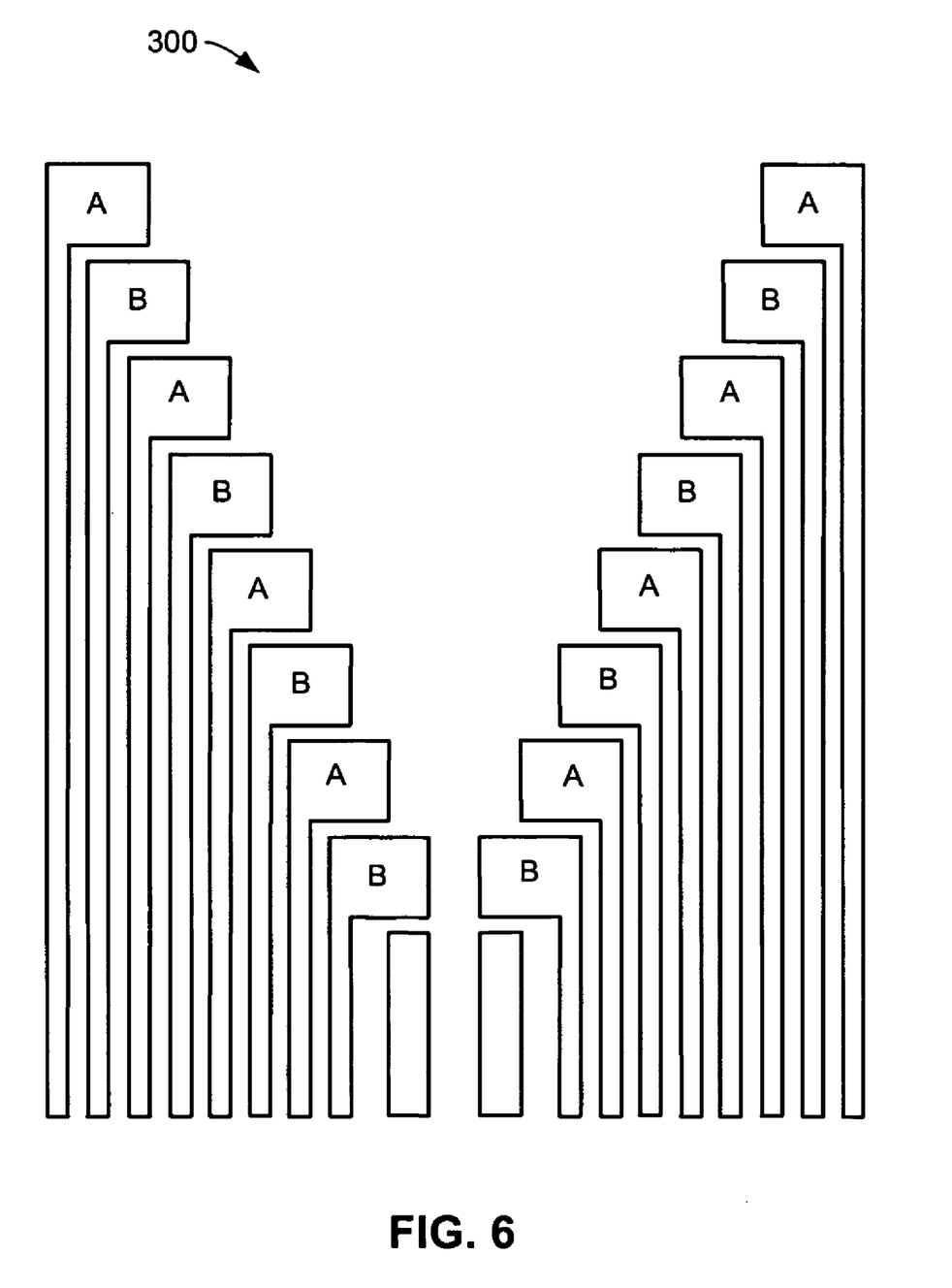
FIG. 6 is a plan view of a target pattern formed via the combined multiple exposure of each of a sub-pattern in accordance with an embodiment of the present invention.

Referring now to FIG. 6, therein is shown a plan view of the target pattern 300 formed via the combined multiple exposure of each of the sub-pattern 400, of FIGS. 4 and 5, in accordance with an embodiment of the present invention. The target pattern 300 can be transferred to the photoresist material 116, of FIG. 1, for each corresponding layer via a multiple exposure technique by exposing each of the sub-pattern 400 separately or simultaneously, thereby defining all of the features of the target pattern 300. It is to be understood that either set of features marked "A" or "B" could be exposed first and then followed by the other set of features to form the target pattern 300.

The technique described above by FIGS. 3-6 helps to eliminate the inherent intra-layer registration and overlay error common to double exposure/double etch processes, by pairing double patterning layers, such as PC layers and CT layers, on a same reticle. By way of example, a PC layer can refer to poly layer that denotes the shape of poly-silicon structures and a CT layer can refer to a cut-poly layer that denotes an opening in poly-silicon structures. The present embodiment achieves this because each of the sub-patterns 400 is written on the same reticle at the same time, therefore eliminating writer-to-writer drift and source drift. Furthermore, since the reticle contains multiple images (e.g., two or more of the sub-pattern 400), it only needs to be aligned once in a scanner in order to be positioned correctly relative to the substrate 118, of FIG. 1. Accordingly, misregistration per layer is reduced without having to load and accurately register a new reticle.

As such, the present embodiment provides a system and method that eliminates inherent intra-layer registration and overlay error for double-patterning lithography by employing a pairing scheme that matches suitable double patterning layers on a same reticle.

Figure 7:
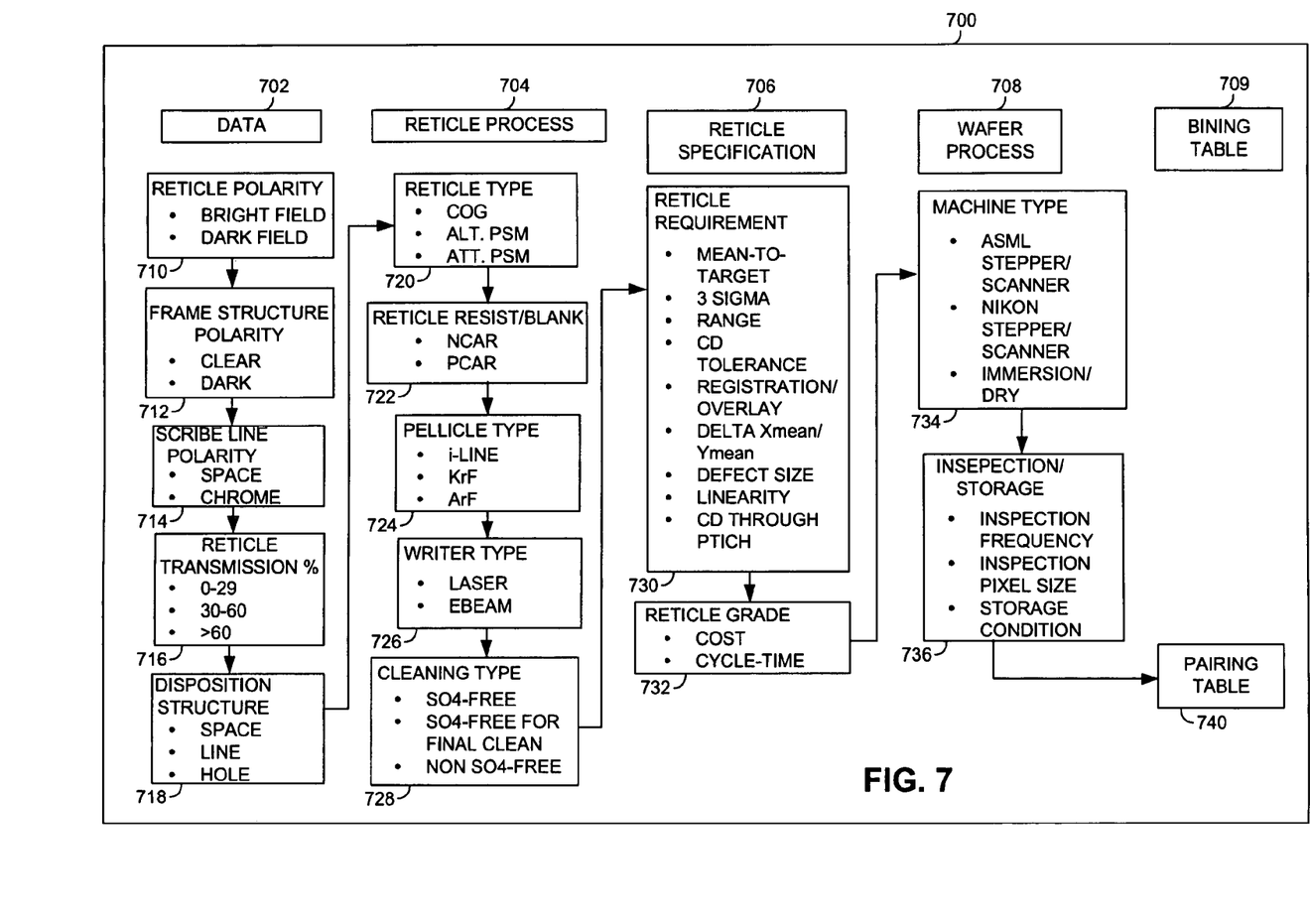
FIG. 7 is a flowchart describing a multi-layer reticle grouping/pairing flow for the formation of a reticle system in accordance with an embodiment of the present invention.

Referring now to FIG. 7, therein is shown the flowchart describing a multi-layer reticle grouping/pairing flow 700 for the formation of the reticle system 110, of FIG. 1, in accordance with an embodiment of the present invention. The system and method of the multi-layer reticle grouping/pairing flow 700 provides a pairing scheme to match suitable multiple layers on a same reticle. By way of example, the pairing scheme matches suitable multiple layers on the same reticle for improving CD performance by employing one or more groupings and/or pairing factors.

It will be appreciated by those skilled in the art that the pairing factors can be described as a subset within the groupings and that within a single grouping, there can be multiple pairings of pairing factors, but typically there should not be any pairing of pairing factors from different groupings.

In some embodiments, the multi-layer reticle grouping/pairing flow 700 utilizes one or more groupings, such as a data group 702, a reticle process group 704, a reticle specification group 706, a wafer process group 708, a bining table group 709, or a combination thereof, to design each of the image pattern 200, of FIG. 2, or the sub-pattern 400, of FIGS. 4 and 5, formed on and/or within the reticle system 110.

Within each of the groupings, there are several pairing factors (or more generically referred to as factors) that may be considered when implementing the multi-layer reticle grouping/pairing flow 700 described herein. For example, within the data group 702, one or more pairing factors such as a reticle polarity factor 710, a frame structure polarity factor 712, a scribe line polarity factor 714, a reticle transmission percent factor 716, a disposition structure factor 718, or a combination thereof, may be considered when designing and grouping/pairing each of the image pattern 200 and the sub-pattern 400. Additionally, within the reticle process group 704, one or more factors such as a reticle type factor 720, a reticle resist blank factor 722, a pellicle type factor 724, a writer type factor 726, a cleaning type factor 728, or a combination thereof, may be considered when designing and grouping/pairing each of the image pattern 200 and the sub-pattern 400. Further, within the reticle specification group 706, one or more factors such as a reticle requirement factor 730, a reticle grade factor 732, or a combination thereof, may be considered when designing and grouping/pairing each of the image pattern 200 and the sub-pattern 400. Furthermore, within the wafer process group 708, one or more factors such as a machine type factor 734, an inspection/storage factor 736, or a combination thereof, may also be considered when designing and grouping/pairing each of the image pattern 200 and the sub-pattern 400.

Generally, each of the factors may contain several elements that may also be considered when implementing the multi-layer reticle grouping/pairing flow 700. For example, within the data group 702, the reticle polarity factor 710 may consider whether the reticle is a bright field reticle or a dark field reticle; the frame structure polarity factor 712 may consider whether the frame structure polarity is either clear or dark; the scribe line polarity factor 714 may consider whether the scribe line is either a space or chrome; the reticle transmission percent factor 716 may consider whether the reticle transmission percent varies between about zero percent (0%) and about twenty-nine percent (29%) dark, or between about thirty percent (30%) and about sixty percent (60%) dark, or above about sixty percent (60%) dark; and/or the disposition structure factor 718 may consider whether the structures/patterns to be formed on the reticle system 110 are line and space or hole. Generally, the multi-layer reticle grouping/pairing flow 700 matches multiple layers on a reticle by grouping/pairing layers together on the same reticle that exhibit similar elements within their factor.

By way of example, the present inventors have discovered that the CD performance of the reticle system 110 can be improved by grouping/pairing the multiple layers within the reticle system 110 to possess substantially similar reticle and frame structure polarity. Additionally, the present inventors have discovered that for effective mask grouping that individual layer polarity, such as reticle polarity and disposition structure polarity, must be the same because it is extremely difficult to optimize a plasma etch recipe to improve CD line and space etch linearity at the same time.

The present inventors have also discovered that the CD performance of the reticle system 110 can be improved by grouping/pairing the multiple layers formed on the reticle system 110 within one of the three reticle transmission percent categories given above. By forming the multiple layers to all be within one of the three reticle transmission percent categories, the reticle transmission percent difference between the multiple layers is rarely in excess of twenty (20) percent, thereby preventing the degradation of CD performance common to multiple layers with reticle transmission percent differences in excess of twenty (20) percent.

By way of example, it has been discovered that reticle transmission percent differences between multiple layers in excess of twenty (20) percent (e.g., a 20% difference means the difference between a reticle transmission of 40% and a reticle transmission of 60%) generally leads to decreased CD performance due in part to the difficulty of optimizing the plasma etch recipe for the reticle system 110. As an exemplary illustration, a layer with a reticle transmission percent of twenty (20) could be paired with a layer possessing a reticle transmission percent of thirty (30). To the contrary, a layer with a reticle transmission percent of twenty (20) should not be paired with a layer possessing a reticle transmission percent of seventy (70), for example, because large density difference for different images will cause issue on CD SPEC and CD-linearity profile due to problem faced in the photomask plasma etch optimization. Furthermore, it has been discovered that reticle transmission percent differences in excess of twenty (20) percent adversely affects reticle CD mean-to-target because the entire reticle writing process cannot be centered and adjusted to produce both small and large critical feature sizes within the same reticle accurately.

It will be appreciated by those skilled in the art that a reticle transmission factor can be described as the total quartz (clear) area inside of the reticle exposure field as divided by the area of the reticle exposure field. Typically, a relatively bright field reticle (gate/active/implants) will have a reticle transmission of about seventy-five (75) percent, whereas a relatively dark field reticle (contacts, metals, vias) will have a reticle transmission of about twenty-five (25) percent.

The present inventors have also discovered that the CD performance of the reticle system 110 can also be improved by grouping/pairing the multiple layers formed on the reticle system 110 with a similar or same disposition structure (i.e., either line and space structures grouped together or hole structures grouped together) and a similar or same structure polarity. By way of example, a similar or same structure polarity can refer to a similar or same desired feature polarity (positive/negative) and a similar or same reticle polarity (e.g., lightfield/darkfield).

As such, every pattern can be generally categorized as lines and spaces or holes. The present inventors have discovered that lines and spaces should not be mixed with holes on the same reticle because the reticle manufacturing process is different for the different types structures. For example, it becomes very difficult to center and adjust the entire reticle writing process when producing both lines/spaces and hole critical features on the same reticle. Accordingly, this creates an obstacle for timely and process effective reticle fabrication if the device layers are not grouped or paired effectively and correctly.

Additionally, within the reticle process group 704, the reticle type factor 720 may consider whether the reticle is a chrome on glass (COG) reticle, an alternating phase shift mask/reticle (ALT. PSM), or an attenuating phase shift mask/reticle (ATT. PSM); the reticle resist blank factor 722 may consider whether the reticle resist blank is either a negative chemically amplified resist (nCAR) or a positive chemically amplified resist (pCAR); the pellicle type factor 724 may consider whether the wavelength of the radiation source is either an i-line wavelength (i.e., around 365 nanometers) or a deep ultra-violet wavelength, such as that produced by a krypton fluoride excimer laser or a argon fluoride excimer laser; the writer type factor 726 may consider whether the writer is a laser writer or an electron beam writer; and/or the cleaning type factor 728 may consider whether the cleaners are SO4-free, SO4-free for the final clean, or non SO4-free. It will be appreciated by those skilled in the art that SO4 cleaning refers to the use of sulfates within the mask cleaning process. These sources of sulfate ion arise from sulfuric-peroxide resist striping and pre-cleaning activities. Generally, the multi-layer reticle grouping/pairing flow 700 matches multiple layers on a reticle by grouping/pairing layers together on the same reticle that exhibit similar elements within their factor.

It has been discovered that by grouping/pairing each of the multiple layer patterns on the reticle system 110 according to the reticle process parameters described above that the CD performance of the reticle system 110 can be improved. For example, a suitable reticle process grouping/pairing may account for or utilize substantially similar reticle writer types, reticle resist blank types, reticle types and pellicle types when grouping/pairing multiple layers on the same reticle. In some embodiments, suitable reticle process grouping/pairing may mean trying to group/pair multiple layers that use COG, alternating phase shift techniques, or an attenuating phase shift techniques on the same reticle (i.e., it is best to not mix reticle types on the same one of the reticle system 110); suitable reticle process grouping/pairing may mean trying to group/pair multiple layers that use either NCAR or PCAR reticle resist blanks on the same reticle; suitable reticle process grouping/pairing may mean trying to group/pair multiple layers that use one of i-line, KrF, or ArF pellicle types on the same reticle; suitable reticle process grouping/pairing may mean trying to group/pair multiple layers that use either laser or electron beam writer types on the same reticle; and/or suitable reticle process grouping/pairing may mean trying to group/pair multiple layers that use one of SO4-free, SO4-free for final clean, or non SO4-free cleaning types on the same reticle.

Further, within the reticle specification group 706, the reticle requirement factor 730 may consider process measurements such as mean-to-target, three (3) sigma, range, CD tolerance, registration/overlay, delta Xmean/Ymean, defect size, linearity, and/or CD through pitch; and the reticle grade 732 may consider the cost of the reticle system 110 and/or the cycle-time endured by the reticle system 110. It will be appreciated by those skilled in the art that range can be described as the performance of all CD mean-to-target (MTT) measurement in a single axis (e.g., horizontal or vertical). For example, range in an X-direction is specified by its maximum and minimum value in the horizontal axis. An MTT value in the X-direction that is between these two values is said to be within the range. Moreover, it will be appreciated by those skilled in the art that CD linearity can refer to the deviations from each target values bias between large and small features. CD range for linearity performance is the (maximum CD error-minimum CD error) for all linearity measurement points.

It is to be understood that the following ranges given below are provided merely for purposes of illustration and are to be construed as exemplary and non-limiting. By way of example, in some embodiments, the range for the mean-to-target can vary from about 5 nm to about 200 nm @4X (mask level), the range for 3 sigma can vary from about 3 nm to about 200 nm @4X (mask level), the range for the "range" within the reticle requirement factor 730 can vary from about 5 nm to about 50 nm @4X (mask level), the range for the CD tolerance can vary from about 10 nm to about 80 nm @4X (mask level), the range for the registration/overlay can vary from about 12 nm to about 60 nm @4X (mask level), the range for the delta Xmean/Ymean can vary from about 3 nm to about 20 nm @4X (mask level), the range for the defect size can vary from about 6 nm to about 100 nm @4X (mask level), the range for the delta Xmean/Ymean can vary from about 3 nm to about 20 nm @4X (mask level), the range for linearity can vary from about 10 nm to about 20 nm @4X (mask level), and the range for the CD through pitch can vary from about 10 nm to about 20 nm @4X (mask level).

Generally, the multi-layer reticle grouping/pairing flow 700 matches multiple layers on a reticle by grouping/pairing layers together on the same reticle that exhibit similar process measurements within their factor.

It has been discovered that by grouping/pairing each of the multiple layer patterns on the reticle system 110 according to the reticle specification parameters described above that the CD performance of the reticle system 110 can be improved. For example, a suitable reticle specification grouping/pairing may account for or utilize substantially similar reticle requirements and reticle grade. In some embodiments, suitable reticle specification grouping/pairing may mean trying to group/pair specific values of mean-to-target, three (3) sigma, range, CD tolerance, registration/overlay, delta Xmean/Ymean, defect size, linearity, and/or CD through pitch within their respective preferred reticle requirement ranges on the same reticle and/or grouping/pairing substantially similar cost and/or cycle-time reticle grades on the same reticle.

By employing the multi-layer reticle grouping/pairing flow 700, cost quotations for the reticle system 110 can be determined by ascertaining the highest required reticle grade for all of the multiple layers (e.g., the different process layers) within the reticle and assigning that value to the job. Additionally, by employing the multi-layer reticle grouping/pairing flow 700, the disposition of defects and/or repair of the reticle system 110 could be based on the highest reticle grade for the different multiple layers within the reticle system 110 to be fixed.

Furthermore, within the wafer process group 708, the machine type factor 734 may consider what type of machine is being employed (e.g., the photolithography system 100, of FIG. 1), such as an ASML stepper/scanner or a Nikon stepper/scanner, for example, or whether the lithographic scheme is immersion or a dry development process; and/or the inspection/storage factor 736 may consider inspection frequency, inspection pixel size, and/or storage conditions, for example. Generally, the multi-layer reticle grouping/pairing flow 700 matches multiple layers on a reticle by grouping/pairing layers together on the same reticle that exhibit similar elements within their factor.

It has been discovered that by grouping/pairing each of the multiple layer patterns on the reticle system 110 according to the wafer process parameters/elements described above that the CD performance of the reticle system 110 can be improved. For example, a suitable wafer process grouping/pairing may account for or utilize substantially similar machine types and/or inspection/storage methods for layers placed on the same reticle. In some embodiments, suitable wafer process grouping may mean grouping/pairing the multiple layer patterns on each reticle according to the type of machine (e.g., an ASML stepper/scanner or a Nikon stepper/scanner) that will use the reticle, and/or grouping/pairing the multiple layer patterns on each reticle according to lithographic scheme employed, such as immersion or dry, and/or grouping/pairing the multiple layer patterns according to substantially similar inspection frequency requirements, inspection pixel size, and/or storage conditions (e.g., an $N_2$ cabinet, a bare reticle stocker, a reticle standard mechanical interface pod and/or compact cases) on the same reticle.

For example, for effective reticle inspection in the manufacturing line, inspection frequency and inspection setting (e.g., pixel size and scattering bar desense) should be similar or the same for layers grouped/paired on the same reticle. It will be appreciated by those skilled in the art that scattering bar desense can refer to a reduction of inspection sensitivity so that scattering bar is not captured as false error during inspection while inspection sensitivity for typical defects, such as crystal growth, repair sites, missing anti-reflective coating, and ESD damage, remain unchanged. Additionally, be way of example, efficient use of storage space can be achieved if critical device layers of the intended identical storage space are grouped/paired together.

Furthermore, within the bining table group 709 a pairing table factor 740 may exist. The pairing table can help to categorize similar or like layers based upon grouping/pairing factors such as reticle grade, reticle transmission percent, polarity, dark/bright field, pellicle type, contact and line/space layers, and layer sequence (e.g., a wafer process sequence whereby semiconductor devices are fabricated). Generally, the pairing table helps to sort out all of the possible combinations and permutations a specific technology node/process may employ.

Generally, the formation of the reticle system 110 by the multi-layer reticle grouping/pairing flow 700 will utilize one or more or all of the groupings described above and one or more or all of the pairing factors described above. For example, in some embodiments, the multi-layer reticle grouping/pairing flow 700 may analyze information from the data group 702, the reticle process group 704 and the reticle specification group 706 by considering factors such as: the reticle grade factor 732, the reticle transmission percent factor 716, the reticle polarity factor 710, the pellicle type factor 724, the disposition structure factor 718 and/or a layer sequence. This information could then be used to pair the multiple layers on the reticle system 110, wherein the multiple layer reticle (i.e., the reticle system 110) formed by the multi-layer reticle grouping/pairing flow 700 exhibits improved CD performance over that of a multiple layer reticle formed without the use of the multi-layer reticle grouping/pairing flow 700. Although, the above provides a specific application of the multi-layer reticle grouping/pairing flow 700, it is to be understood that the reticle system 110 could be formed by any combination of one or more of the groupings and/or one or more of the pairing factors of the multi-layer reticle grouping/pairing flow 700.

Additionally, it will be appreciated by those skilled in the art that the parameters for each of the factors described above can be defined by their collective ability to improve the CD performance of the reticle system 110.

Accordingly, the multi-layer reticle grouping/pairing flow 700 provides a robust method that strategically determines how device layers within the integrated circuit system 102 are paired in the creation of a multi-layer reticle, such as the reticle system 110. By employing the multi-layer reticle grouping/pairing flow 700 described above, device layers can be grouped and paired for effective reticle and wafer processing.

Figure 8:
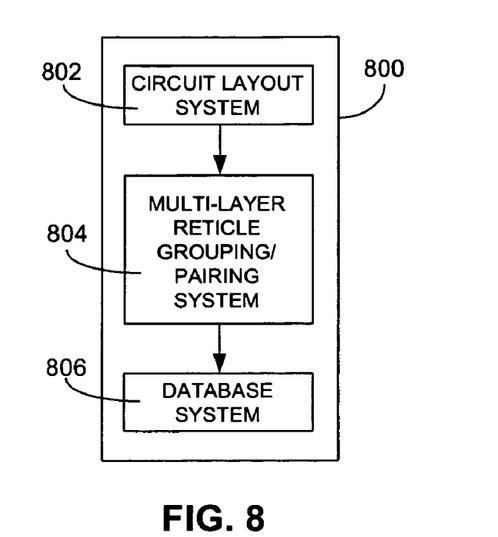
FIG. 8 is a simplified flowchart describing a reticle generation system, which may be used by a designer to develop a reticle system in accordance with an embodiment of the present invention.

Referring now to FIG. 8, therein is shown a simplified flowchart describing a reticle generation system 800, which may be used by a designer to develop the reticle system 110, of FIG. 1, in accordance with an embodiment of the present invention. The reticle generation system 800 can be used to fabricate a multiple layer reticle, such as the reticle system 110 with more than one of the image pattern 200, of FIG. 2.

The reticle generation system 800 may include a circuit layout system 802, a multi-layer reticle grouping/pairing system 804, which provides a grouping/pairing scheme to match suitable multiple layers on the same reticle as discussed supra in FIG. 7, and a database system 806 for storing the multiple layer patterns generated for each of the reticle system 110, of FIG. 1. It will be appreciated by those skilled in the art that the term "system" with regards to the circuit layout system 802, the multi-layer reticle grouping/pairing system 804, and the database system 806 may, more specifically, refer to software and/or hardware configurations. Additionally, it is to be understood that the circuit layout generated by the circuit layout system 802 may be used to make the various multiple layer reticles (e.g., the reticle system 110) via the multi-layer reticle grouping/pairing system 804, which can be used to image the image pattern 200 on the different layers of the integrated circuit system 102.

After the circuit layout system 802 determines the design of the integrated circuit system 102, of FIG. 1, each layer is then analyzed via the multi-layer reticle grouping/pairing system 804 to determine which layers should be grouped/paired together to maximize the CD performance of the reticle system 110. Details of the multi-layer reticle grouping/pairing system 804 is described above in reference to the multi-layer reticle grouping/pairing flow 700, of FIG. 7. Subsequent to the multi-layer reticle grouping/pairing system 804 determining the appropriate grouping/pairing of the multiple layers, this data is then sent to the database system 806. The grouping/pairing of the multiple layers for each of the reticle system 110 may then be extracted from the database system 806, formatted, and sent to a reticle production system.

Figure 9:
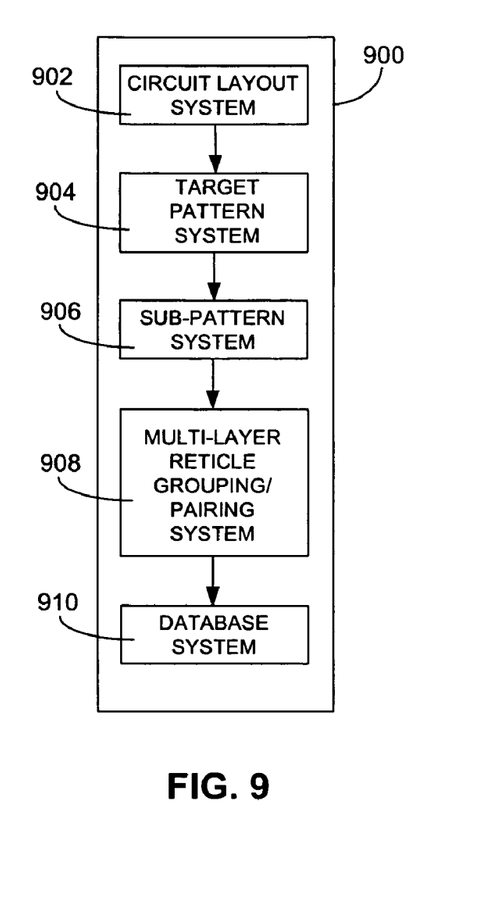
FIG. 9 is a simplified flowchart describing a reticle generation system, which may be used by a designer to develop a reticle system in accordance with another embodiment of the present invention.

Referring now to FIG. 9, therein is shown a simplified flowchart describing a reticle generation system 900, which may be used by a designer to develop the reticle system 110, of FIG. 1, in accordance with another embodiment of the present invention. The reticle generation system 900 can be used to fabricate a multiple layer reticle, such as the reticle system 110 with more than one of the sub-pattern 400, of FIGS. 4 and 5.

The reticle generation system 900 may include a circuit layout system 902, a target pattern system 904 for generating the target pattern 300, of FIG. 3, for each layer, a sub-pattern system 906 for generating/splitting the sub-pattern 400, of FIGS. 4 and 5, from the target pattern 300, a multi-layer reticle grouping/pairing system 908, which provides a grouping/pairing scheme to match suitable multiple layers on the same reticle as discussed supra in FIG. 7, and a database system 910 for storing the multiple layer patterns generated for each of the reticle system 110. It will be appreciated by those skilled in the art that the term "system" with regards to the circuit layout system 902, the target pattern system 904, the sub-pattern system 906, the multi-layer reticle grouping/pairing system 908, and the database system 910 may, more specifically, refer to software and/or hardware configurations. Additionally, it is to be understood that the circuit layout generated by the circuit layout software 902 may be used to make the various multiple layer reticles (e.g., the reticle system 110) via the multi-layer reticle grouping/pairing system 908, which can be used to image the sub-pattern 400 on the different layers of the integrated circuit system 102.

After the circuit layout system 902 determines the design of the integrated circuit system 102, of FIG. 1, each layer is then mapped out and the target pattern 300 is created for each layer via the target pattern system 904. The target pattern system 904 then sends this information to the sub-pattern system 906, which can then split the target pattern 300 into two or more of the sub-pattern 400 when the pitches of the target pattern 300 exceed the resolution limits of the photolithography system 100, of FIG. 1. The two or more of the sub-pattern 400 (i.e., the information) produced by the sub-pattern system 906 is then analyzed via the multi-layer reticle grouping/pairing system 908 to determine which of the sub-pattern 400 should be grouped/paired together to maximize the CD performance of the reticle system 110. Details of the multi-layer reticle grouping/pairing system 908 are described above in reference to the multi-layer reticle grouping/pairing flow 700, of FIG. 7. Subsequent to the multi-layer reticle grouping/pairing system 908 determining the appropriate grouping/pairing of the sub-pattern 400, this data is then sent to the database system 910. The grouping/pairing of the sub-pattern 400 for each of the reticle system 110 may then be extracted from the database system 910, formatted, and sent to a reticle production system.

Figure 10:
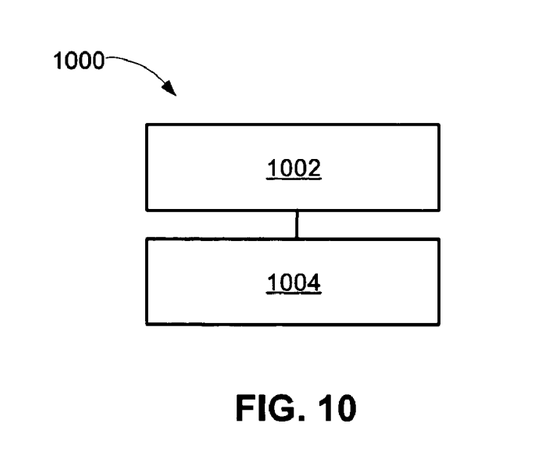
FIG. 10 is a flow chart of a reticle system for a reticle system in accordance with an embodiment of the present invention.

Referring now to FIG. 10, therein is shown a flow chart of a reticle system 1000 for the reticle system 110 in accordance with an embodiment of the present invention. The reticle system 1000 includes providing a reticle system in a block 1002; and assigning two or more of an image pattern onto the reticle system to form one or more layers of an integrated circuit system by grouping and pairing each of the image pattern onto the reticle system according to a multi-layer reticle grouping/pairing flow in a block 1004.

In another embodiment, a cross-technology reticle system is provided. The cross-technology reticle system includes a plurality of images $200_{1-X}$, where $X \geq 2$. The images, for example, may be arranged in an array. The array may be a 1-dimensional or 2-dimensional array, such as that shown in FIGS. 2a-b. Arranging the images in other configurations is also useful.

In one embodiment, images correspond to at least first and second technologies. Technology can refer to a technology node or generation, such as 45 nm or 40 nm. Technology can also include a half technology node, for example, the interim process toward the next technology generation. Other technology nodes or half nodes may also be included. For reticles with more than 2 images, more than 2 technologies can be included.

In one embodiment, the images comprise the same layer of an integrated circuit of different technologies. In one embodiment, the images relate to a first technology (n) and the next generation technology (n+1). The next generation technology can include the next full node or next half node. Table 1 shows an exemplary technology pairs of a cross-reticle system with first and second images.

TABLE 1

| Examples | First Image Technology/layer | Second Image Technology/layer |
|---|---|---|
| 1 | 45 nm/Poly | 40 nm/Poly |
| 2 | 45 nm/Active | 40 nm/Active |
| 3 | 45 nm/Metal 1 | 40 nm/Metal 1 |
| 4 | 45 nm/Metal 2 | 40 nm/Metal 2 |
| 5 | 32 nm/Poly | 28 nm/Poly |
| 6 | 32 nm/Active | 28 nm/Active |
| 7 | 32 nm/Metal 1 | 28 nm/Metal 1 |
| 8 | 32 nm/Metal 2 | 28 nm/Metal 2 |

Providing cross-technology pairs is also useful. Additionally, providing reticles with cross-technology groups having more than first and second technologies and more than first and second images is also useful. For example, the reticle can be provided with four images, as shown in FIG. 2b. Providing a reticle with other number of images is also useful.

In another embodiment, the reticle system comprises a cross-technology and cross-layer (CTCL) reticle system. The CTCL reticle system comprises images from 2 or more technologies and from 2 or more layers of an integrated circuit system. The CTCL may be from the same IC or different types of ICs.

Table 2 shows an exemplary technology and level groupings of a CTCL reticle system with four images. As shown, the reticle comprises first and second technology pairs. The first pair comprises different technologies of a first level of an IC and the second pair comprises different technologies of a second level of an IC

TABLE 2

| Examples | First Image Technology/layer | Second Image Technology/layer | Third Image Technology/layer | Fourth Image Technology/layer |
|---|---|---|---|---|
| 1 | 45 nm/Poly | 40 nm/Poly | 45 nm/Active | 40 nm/Active |
| 2 | 45 nm/Metal 1 | 40 nm/Metal 1 | 45 nm/Metal 2 | 40 nm/Metal 2 |
| 3 | 32 nm/Poly | 28 nm/Poly | 32 nm/Active | 28 nm/Active |
| 4 | 32 nm/Metal 1 | 28 nm/Metal 1 | 2 nm/Metal 2 | 28 nm/Metal 2 |

Other types of technology and level groupings, as shown in Tables 3-4, are also useful. Tables 3-4 show several examples of cross technology reticle schemes which combine different number of near generation technologies with different levels as long as their mask processes are the same.

With respect to Table 4, 2X metal levels (e.g., 2X Metal 1 or 2X Metal 2) refers to metal layers which are less critical than non-2X metal levels. For example, dimensions and requirements for 2X metal layers are larger in size and less stringent as compared to the non-2X metal layers.

As shown in the second example, the reticle can have images from three different technologies. The first two images can be of different mask layers from the same technology, e.g., 2X Metal 1 and 2X Metal 2. The third and fourth images can be of different mask layers from another two different technologies.

TABLE 3

| Examples | First Image Technology/layer | Second Image Technology/layer | Third Image Technology/layer | Fourth Image Technology/layer |
|---|---|---|---|---|
| 1 | 40 nm/Metal 1 | 40 nm/Metal 2 | 40 nm/Metal 3 | 45 nm/Metal 1 |
| 2 | 28 nm/Metal 1 | 28 nm/Metal 2 | 28 nm/Metal 3 | 32 nm/Metal 1 |

TABLE 4

| Examples | First Image Technology/layer | Second Image Technology/layer | Third Image Technology/layer | Fourth Image Technology/layer |
|---|---|---|---|---|
| 1 | 28 nm/Metal 1 | 28 nm/Metal 2 | 32 nm/Metal 1 | 40 nm/Metal 1 |
| 2 | 28 nm/2X Metal 1 | 28 nm/2X Metal 2 | 40 nm/Metal 3 | 45 nm/Metal 1 |

Figure 11:
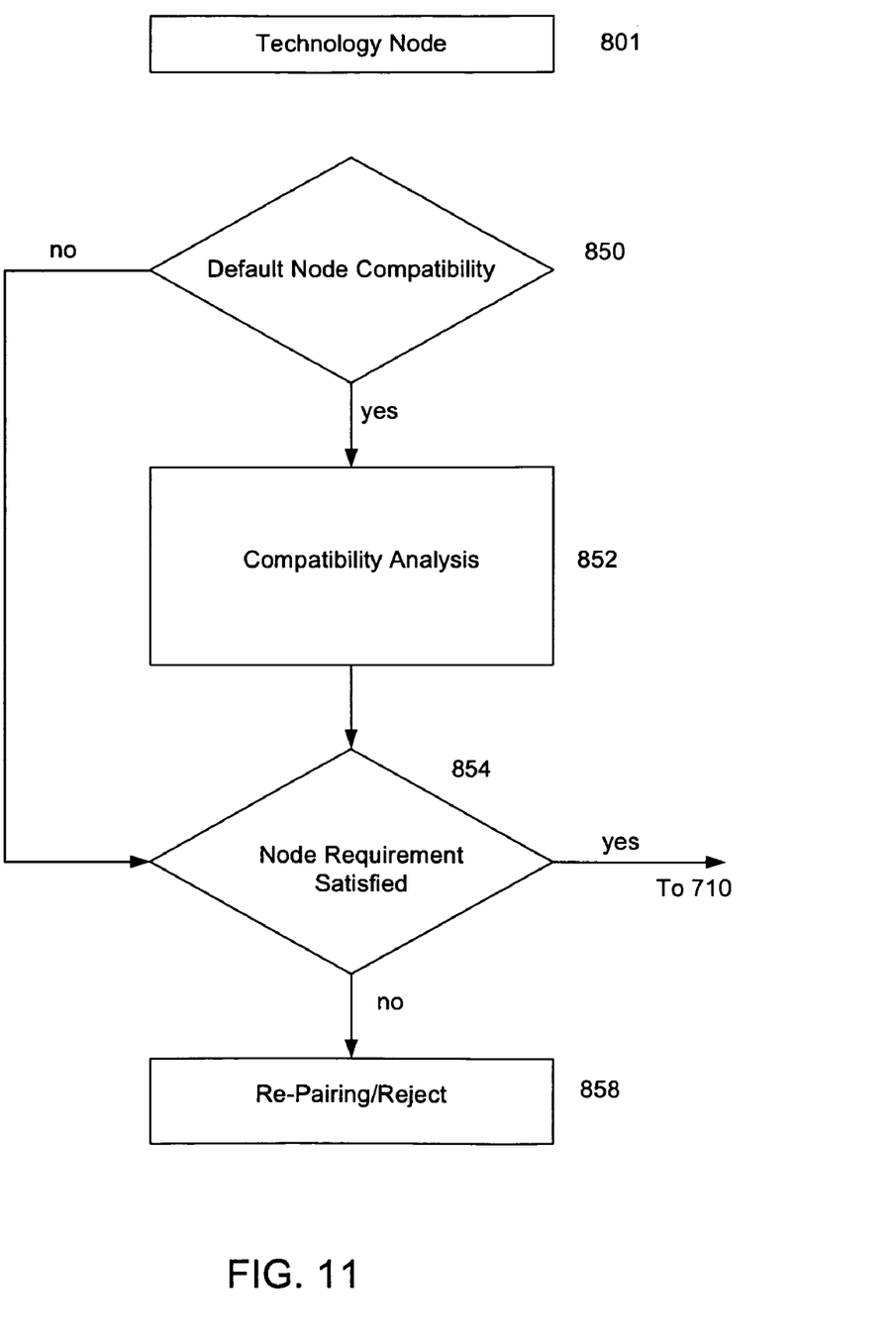
FIG. 11 shows a plan view of another embodiment of a reticle system.

For cross-technology reticles, a technology node requirement is added to the grouping/pairing flow 700 of FIG. 7. FIG. 11 shows an embodiment of a technology node requirement 801. Within the technology node requirement, technologies are determined if technology requirements are satisfied for grouping. For example, a node and half node processes can be defined as default compatible 850. Default compatible technologies are those which automatically satisfy node technology requirements 854 are compatible and can be grouped or paired.

If technologies are not default compatible, compatibility analysis 852 is performed to determine if the technology requirements are satisfied. The compatibility analysis include whether the mask processes of the different technologies are the same. For example, factors which may be considered include whether the technologies use the same mask and optical proximity correction (OPC) processes. Mask processing, for example, refers to the processes related to forming the mask. This may include processes from resist development to final cleanup and mounting of pellicles on the mask. In one embodiment, mask processing involves the following basic processes such as: 1) developing the mask after exposure to laser or e-beam; 2) pattern transfer which includes etching (wet or dry) the chrome that is exposed after resist has been developed or patterned; 3) stripping the resist; and 4) final cleanup. Technologies which utilize the same or similar mask and OPC processes satisfy technology requirements. As such, the technologies are compatible and can be grouped or paired.

For technologies which are compatible, the process may continue to other groupings as described in the multi-layer reticle grouping/pairing flow, as described in FIG. 7. For example, the flow continues to the reticle polarity factor 710 of the data group. If technology requirement is not satisfied, the flow terminates. The rejected technology nodes can be re-paired to determine if technology requirements are satisfied at step 858.

The reticles developed can be used to form semiconductor devices or integrated circuits (ICs). For example, the reticles can be used to pattern a substrate to form the features which serve as components on the substrate. The components are interconnected to form devices or ICs with the desired function. The substrate, for example, can be a wafer in which a plurality of devices or ICs are formed. After processing of the wafer is completed, the devices are diced, separating the wafer into individual dies. Continued processing can be performed, such as assembly, testing and packaging to complete forming the devices or ICs.

In alternative embodiments, the reticles can be used to develop processes for forming the devices or ICs. For example, the reticles can be used to define process parameters. The defined process parameters are then used to form devices and ICs.

It has been discovered that the present invention thus has numerous aspects. One such aspect is that the present invention can improve the CD performance of a reticle system. The present embodiments achieve this by using a multi-layer reticle grouping/pairing flow that matches corresponding multiple layers on a same reticle.

Another aspect is that the present invention reduces the cost of producing a reticle system set by forming multiple layers on the same reticle.

Another aspect is that the present invention helps customers/users prevent faulty tapeouts due to inappropriate pairing.

Another aspect is that the present invention helps to reduce non-recurring engineering costs and the total number of reticles needed.

Another aspect is that the present invention reduces the possible increased reticle cycle-time during reticle production if inappropriate layers are paired together.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the reticle system and the integrated circuit system of the present invention furnishes important and heretofore unknown and unavailable solutions, capabilities, and functional aspects for improving reticle and integrated circuit performance. The resulting processes and configurations are straightforward, cost-effective, uncomplicated, highly versatile and effective, can be implemented by adapting known technologies, and are thus readily suited for efficiently and economically manufacturing integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. A method of fabricating a device comprising:
forming a mask comprising multiple images, wherein the multiple images comprise compatible technologies;
patterning a substrate using the mask, wherein the multiple images correspond to respective patterning processes; and
continue processing of the substrate to complete processing of the substrate to form the desired function of the device.

2. The method of claim 1 wherein the substrate comprises a wafer for forming a plurality of devices in parallel.

3. The method of claim 2 comprises:
dicing the wafer into individual dies after processing of the wafer is completed; and
assembling, testing and packing the dies into devices.

4. The method of claim 1 wherein forming the multiple images are used to develop device processes used to fabricate one type or types of different devices.

5. The method of claim 4 wherein the device processes are used to pattern the substrate which comprises a wafer for forming a plurality of devices in parallel.

6. The method of claim 5 comprises:
dicing the wafer into individual dies after processing of the wafer is completed; and
assembling, testing and packing the dies into devices.

7. The method of claim 1 wherein the multiple images correspond to different technologies or devices.

8. The method of claim 7 wherein compatible technologies satisfy technology node requirements.

9. The method of claim 7 wherein compatible technologies employ same or similar mask processes.

10. The method of claim 7 wherein compatible technologies employ same or similar OPC processes.

11. The method of claim 7 wherein compatible technologies employ same or similar mask and OPC processes.

12. The method of claim 1 wherein the multiple images comprise different layers of a same device.

13. A mask for device fabrication comprising:
a mask substrate; and
a plurality of images formed on the mask substrate, wherein the plurality of images are technology node compatible, wherein an image corresponds to a different patterning process used to fabricate one or more devices.

14. The mask of claim 13 wherein the plurality of images are used to develop device processes used to fabricate one type or different type of devices.

15. The mask of claim 13 wherein the plurality of images correspond to different technologies or devices.

16. A method for forming a mask used in device fabrication comprising:
providing a mask substrate; and
forming a plurality of images on the mask substrate, wherein the plurality of images comprise compatible technologies, wherein an image corresponds to a different patterning process used to fabricate one or more devices.

17. The method of claim 16 wherein the plurality of images are used to develop device processes used to fabricate one type or different type of devices.

18. The method of claim 16 wherein the plurality of images correspond to different technologies or devices.

* * * * *